US012009242B2

(12) United States Patent
Hsu et al.

(10) Patent No.: US 12,009,242 B2
(45) Date of Patent: Jun. 11, 2024

(54) WAFER TRANSPORT CONTAINER

(71) Applicant: Taiwan Semiconductor Manufacturing Company Limited, Hsinchu (TW)

(72) Inventors: Jyh-Shiou Hsu, Hsin-Chu (TW); Jeng-Shin Ma, Taipei (TW); Cheng-Lung Wu, Zhunan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 290 days.

(21) Appl. No.: 17/446,404

(22) Filed: Aug. 30, 2021

(65) Prior Publication Data

US 2023/0060148 A1  Mar. 2, 2023

(51) Int. Cl.
*H01L 21/677* (2006.01)
*B65G 47/90* (2006.01)
*H01L 21/673* (2006.01)

(52) U.S. Cl.
CPC ........ *H01L 21/67772* (2013.01); *B65G 47/90* (2013.01); *H01L 21/67373* (2013.01); *H01L 21/67376* (2013.01); *H01L 21/67766* (2013.01)

(58) Field of Classification Search
CPC ......... H01L 21/67766; H01L 21/67376; H01L 21/67373; H01L 21/67772; B65D 81/3818
USPC .............................. 206/710–712; 220/592.27
See application file for complete search history.

(56) References Cited

U.S. PATENT DOCUMENTS

| | | | | |
|---|---|---|---|---|
| 5,579,946 A | * | 12/1996 | Rowan | A47J 41/0072 220/592.27 |
| 2008/0107507 A1 | * | 5/2008 | Bufano | H01L 21/67196 414/217.1 |
| 2009/0245978 A1 | * | 10/2009 | Okabe | H01L 21/67775 414/217 |
| 2009/0272743 A1 | * | 11/2009 | Meulen | H01L 21/67373 220/230 |
| 2010/0282638 A1 | * | 11/2010 | Chiu | H01L 21/67369 206/711 |
| 2011/0174389 A1 | * | 7/2011 | Chiu | F16J 15/46 137/223 |

(Continued)

FOREIGN PATENT DOCUMENTS

WO   WO-2018112055 A2 *  6/2018 ............... E05C 9/06

*Primary Examiner* — Rafael A Ortiz
(74) *Attorney, Agent, or Firm* — Harrity & Harrity, LLP

(57) ABSTRACT

A wafer transport carrier includes various components to provide improved air sealing to reduce air leakage into the wafer transport carrier. The wafer transport carrier may include a housing having a hollow shell that contains a vacuum or an inert gas to minimize and/or prevent humidity and oxygen ingress into the wafer transport carrier, a wafer rack that is integrated into the shell of the housing to minimize and/or prevent air leakage around the wafer rack, and/or an enhanced magnet-based door latch to provide air sealing around the full perimeter of the opening of the housing. These components and/or additional components described herein may reduce and/or prevent debris, moisture, and/or other types of contamination from the semiconductor fabrication facility from entering the wafer transport carrier and causing wafer defects and/or device failures.

20 Claims, 18 Drawing Sheets

(56) References Cited

U.S. PATENT DOCUMENTS

2015/0101959 A1* 4/2015 Chou ................ H01L 21/67373
          141/7
2016/0118282 A1* 4/2016 Maraschin ........ H01L 21/67769
          206/711
2016/0340947 A1* 11/2016 Mazzocco ............. E05C 19/166

* cited by examiner

WAFER TRANSPORT CONTAINER

BACKGROUND

A semiconductor wafer may be processed in various semiconductor processing tools in a semiconductor fabrication facility to produce various integrated circuits and/or semiconductor devices. A semiconductor wafer may be transported throughout the semiconductor fabrication facility and/or between the semiconductor processing tools in the semiconductor fabrication facility.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
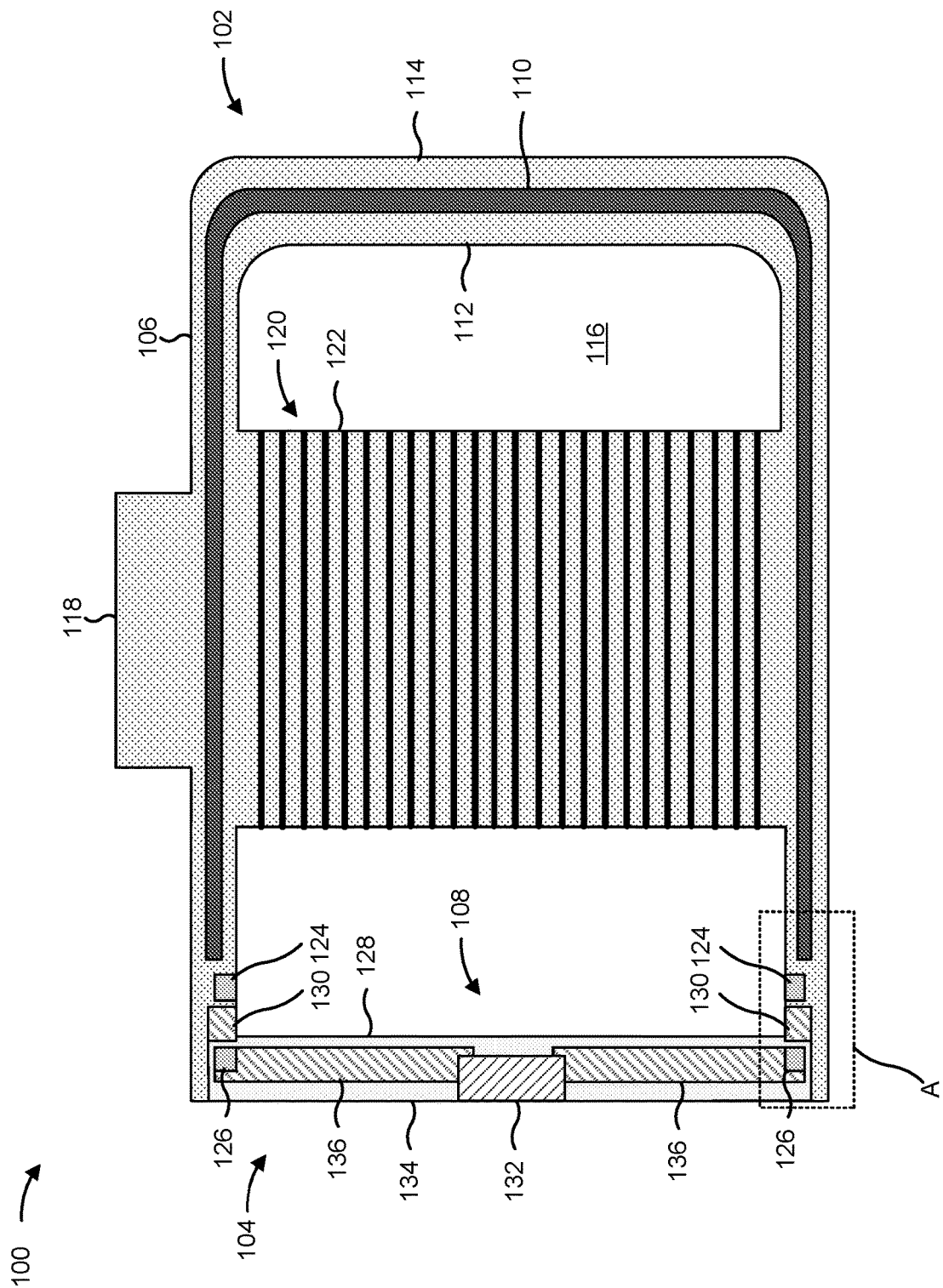
FIGS. 1A-1G are diagrams of an example wafer transport container described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Multiple semiconductor wafers and/or other types of substrates may be transported throughout a semiconductor fabrication facility in a wafer transport carrier. A wafer transport carrier may include a wafer cassette, a front-opening unified pod (FOUP), a pod, a container, or a similar type of device. A wafer transport carrier may be prone to air leakage, which can result in debris, moisture, and/or other types of contamination from the semiconductor fabrication facility entering the wafer transport carrier and causing wafer defects (e.g., condensation, corrosion, oxidation, crystallization, and/or other types of defects) and/or device failures. The longer that semiconductor wafers are stored in the wafer transport carrier, the more likely the semiconductor wafers will be exposed to such contamination.

Some implementations described herein provide a wafer transport carrier that includes various components to provide improved air sealing to reduce air leakage into the wafer transport carrier. The wafer transport carrier may include a housing having a hollow shell that contains a vacuum or an inert gas to minimize and/or prevent humidity and oxygen ingress into the wafer transport carrier, a wafer rack that is integrated into the shell of the housing to minimize and/or prevent air leakage around the wafer rack, and/or an enhanced magnet-based door latch to provide air sealing around the full perimeter of the opening of the housing. These components and/or additional components described herein may reduce and/or prevent debris, moisture, and/or other types of contamination from the semiconductor fabrication facility from entering the wafer transport carrier and causing wafer defects and/or device failures. This may increase semiconductor processing yields, may reduce defects and scrap, and/or may enable longer queue times for semiconductor wafers stored in the wafer transport carrier, which supports the increase in the quantity of processing stages as semiconductor processing node sizes continue to shrink.

FIGS. 1A-1G are diagrams of an example wafer transport container 100 described herein. The wafer transport container 100 may include a wafer cassette, a FOUP, a pod, a container, or another type of container that is configured to hold and/or store a plurality of semiconductor wafers. The wafer transport container 100 may permit semiconductor wafers to be transported throughout various locations of a semiconductor processing facility or a clean room while in an environmentally-controlled container.

FIG. 1A illustrates a cross-section of a side elevation view of the wafer transport container 100. As shown in FIG. 1A, the wafer transport container 100 may include a housing 102 and a door 104. The door 104 is configured to be installed on the housing 102 to form an air-tight seal between the housing 102 and the door 104. Moreover, the door 104 is configured to be removed from the housing 102 to provide access to the housing 102.

As further shown in FIG. 1A, the housing 102 may include a shell 106 that forms an opening 108 through which access to the housing 102 is provided. The door 104 may be installed onto the shell 106 of the housing 102 to cover and seal the opening 108. The shell 106 may be formed of a plastic material, a polymer, or of another rigid non-conductive material. The shell 106 of the housing 102 may be hollow. In particular, a cavity 110 may be formed between an inner wall 112 and an outer wall 114 of the shell 106. The thickness of each of the inner wall 112 and the outer wall 114 may be greater than or equal to 1 millimeter to provide sufficient rigidity and structural integrity to support the storage and transport of semiconductor wafers in the housing 102.

The cavity 110 may be filled with an inert gas such as nitrogen ($N_2$) or a vacuum. The cavity 110, and the inert gas or the vacuum included in the cavity 110, may provide environment isolation for an internal space 116 formed by the shell 106. The opening 108 may be configured to provide access to the internal space 116. The cavity 110, and the inert gas or the vacuum included in the cavity 110, may provide a thermal break between the inner wall 112 and the outer wall 114 of the shell 106, which provides temperature isolation by reducing the transfer of thermal energy from the external environment in which the wafer transport container 100 is located and the internal space 116 of the housing 102. The inert gas or the vacuum in the cavity 110 may provide humidity isolation and oxygen isolation by minimizing or preventing reactions with oxygen ($O_2$) and water ($H_2O$) in the external environment, which reduces the diffusion of oxygen and water through the shell 106 and into the internal space 116. The thickness of the cavity 110 (and thus, the gap between the inner wall 112 and the outer wall 114) may be greater than 1 millimeter to provide sufficient thermal transfer resistance and to achieve a relative humidity increase in the housing 102 of less than 1% per hour, and to achieve an oxygen transmission of less than 100 parts per million per hour between the external environment and the internal space 116.

As further shown in FIG. 1A, the shell 106 may include an overhead hoist transport (OHT) head 118 located on a top side of the housing 102. The OHT head 118 includes a point of attachment by which an OHT or another type of automated material handling system (AMHS) may grip or connect to the wafer transport container 100 to transport the wafer transport container 100 from one location to another location.

The housing 102 may further include a wafer rack 120 located within the internal space 116 formed by the shell 106. The wafer rack 120 may include a plurality of slots 122, where each slot 122 is configured to hold and/or secure a semiconductor wafer therein. The wafer rack 120 may be integrated into the shell 106 of the housing 102 such that shell 106 and the wafer rack 120 are an integrated one-piece component. This reduces air leakage around the mounting points between a wafer rack 120 and a shell 106 that might otherwise occur in two-piece designs, which reduces humidity and oxygen ingress into the housing 102 that might otherwise cause semiconductor wafer contamination. The integrated one-piece component may also provide increased structural integrity, which reduces vibration (and thus, shifting of semiconductor wafers) in the housing 102. The wafer rack 120 and the shell 106 may be formed or manufactured such that the wafer rack 120 and the shell 106 are a single continuous component. As an example, the wafer rack 120 and the shell 106 may be formed from the same molded piece of plastic or polymer.

As further shown in FIG. 1A, the housing 102 may include a plurality of magnets 124 around the perimeter of the opening 108 in the shell 106. The magnets 124 may be magnetically coupled to a plurality of magnets 126 included on the door 104 by a magnetic attraction force when the door 104 is installed over the opening 108 of the housing 102. The magnets 126 may be located around the perimeter of the door 104 and may be located near an inner side 128 of the door 104. When the door 104 is installed on the housing 102 (as shown in FIG. 1A), the magnetic attraction force between the magnets 124 and the magnets 126 may bias, force, or press the inner side 128 of the door 104 against a gasket 130 included around the perimeter of the opening 108 of the housing 102.

The gasket 130 may be formed of a soft material and/or of a deformable material to permit the air-tight seal to be formed between the door 104 and the opening 108. For example, the gasket 130 may be formed of a plastic material, a rubber material, a silicone material, or another gas impermeable material. The gasket 130 may be capable of being at least partially compressed to facilitate the formation of a gap-less seal between the door 104 and the opening 108.

The magnetic attraction force causes an air-tight seal to be formed between the inner side 128 of the door 104 and the gasket 130. Moreover, the magnets 124 and the gasket 130 both being located around the perimeter of the opening 108, and the magnets 126 being located around the perimeter of the door 104 provides an even magnetic attraction force around the perimeter of the opening 108 and around the perimeter of the door 104. This even magnetic attraction force evenly biases the door 104 against the gasket 130, which provides an air seal around the full perimeter of the opening 108 and minimizes and/or prevents gaps between the inner side 128 of the door and the gasket 130 that would otherwise result in air leakage and contaminant ingress into the housing 102.

The door 104 may be selectively installed onto the housing 102 or removed from the housing 102 by respectively strengthening or weakening the magnetic attraction force between the magnets 124 and the magnets 126. The magnets 126 may be moved toward the perimeter of the door 104 to strengthen the magnetic attraction force between the magnets 124 and the magnets 126 such that the door 104 is biased against the gasket 130 to seal the opening 108. The magnets 126 may be moved away from the perimeter (and inward toward the center of the door 104) to weaken the magnetic attraction force such that the door 104 may be removed from the housing 102 to provide access to the internal space 116.

The magnets 126 may be selectively moved outward toward the perimeter of the door 104 or inward toward the center of the door 104 by actuating a plurality of latches 132 included on the door 104. Access to the latches 132 may be provided on an outer side 134 of the door 104 such that a wafer transport tool or a wafer transport carrier door removal device (e.g., included in an interface tool such as an equipment front end module (EFEM)) may actuate the latches 132. The latches 132 may be actuated by rotating the latches 132, translating the latches 132, or by another type of actuation.

Actuation of the latches 132 may cause a plurality of support members 136 that couple (e.g., mechanically couple) the latches 132 and the magnets 126 to move the magnets 126. Each support member 136 may be configured to support and move a respective magnet 126, a plurality of support members 136 may be configured to support and move a single magnet 126, or a combination thereof.

Figure 1B:
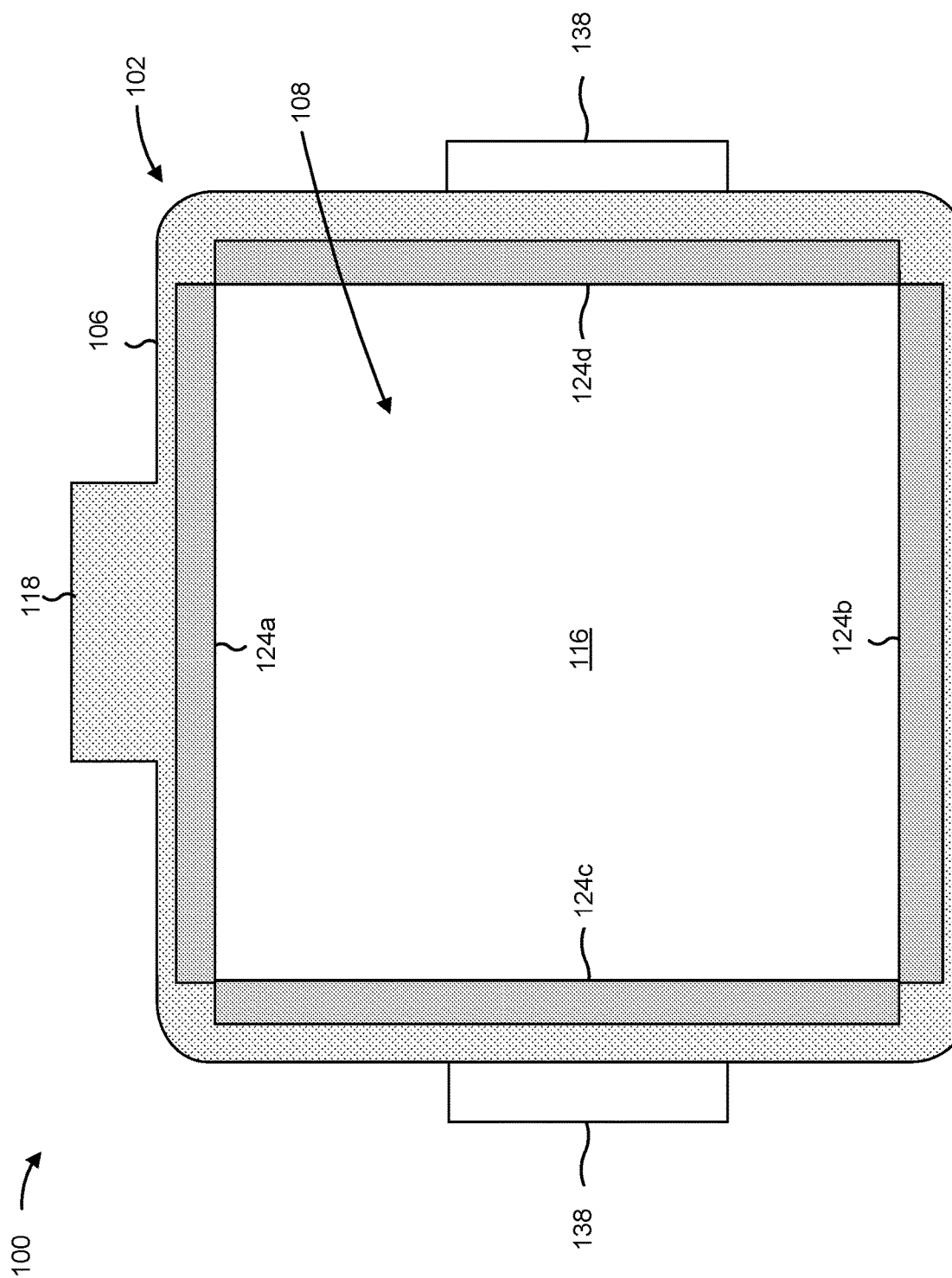

FIG. 1B illustrates a cross-section of a front elevation view into the internal space 116 of the housing 102 formed by the shell 106. The door 104, the wafer rack 120, and the gasket 130 have been omitted from FIG. 1B for the purpose of clarity and to show the details of the magnets 124. As shown in FIG. 1B, the magnets 124 may include a first pair of magnets 124a and 124b and a second pair of magnets 124c and 124d located around the perimeter of the opening 108 (e.g., the internal perimeter of the shell 106 in or near the opening 108). The magnet 124a may be located near a first side (e.g., a top side) of the opening 108 of the housing 102, the magnet 124b may be located near a second side (e.g., a bottom side) of the opening 108 of the housing 102 opposing the first side, the magnet 124c may be located near a third side (e.g., a left side) of the opening 108 of the housing 102, and the magnet 124d may be located near a fourth side (e.g., a right side) of the opening 108 of the housing 102 opposing the third side.

As explained above, the magnets 124 may be located around the perimeter of the opening 108 such that the magnetic attraction force between the magnets 124 and the magnets 126 may evenly press or bias the door 104 against the gasket 130 to minimize and/or prevent gaps, between the inner side 128 of the door 104 and the gasket 130, that would otherwise break the air-tight seal around the opening 108. While FIG. 1B illustrates a plurality of magnets being included around the perimeter of the opening 108 of the housing 102, in some implementations, a single continuous magnet or a different configuration of magnets may be included around the perimeter of the opening 108 in the housing 102.

As further shown in FIG. 1B, the housing 102 of the wafer transport container 100 may further include handles 138 (or side columns) on each side of the housing 102. The handles 138 permit the wafer transport container 100 to be manually transported, for example, by clean room personnel. The handles 138 may be integrated into the shell 106 of the housing 102 to reduce air leakage into the housing 102, similar to the wafer rack 120.

Figure 1C:
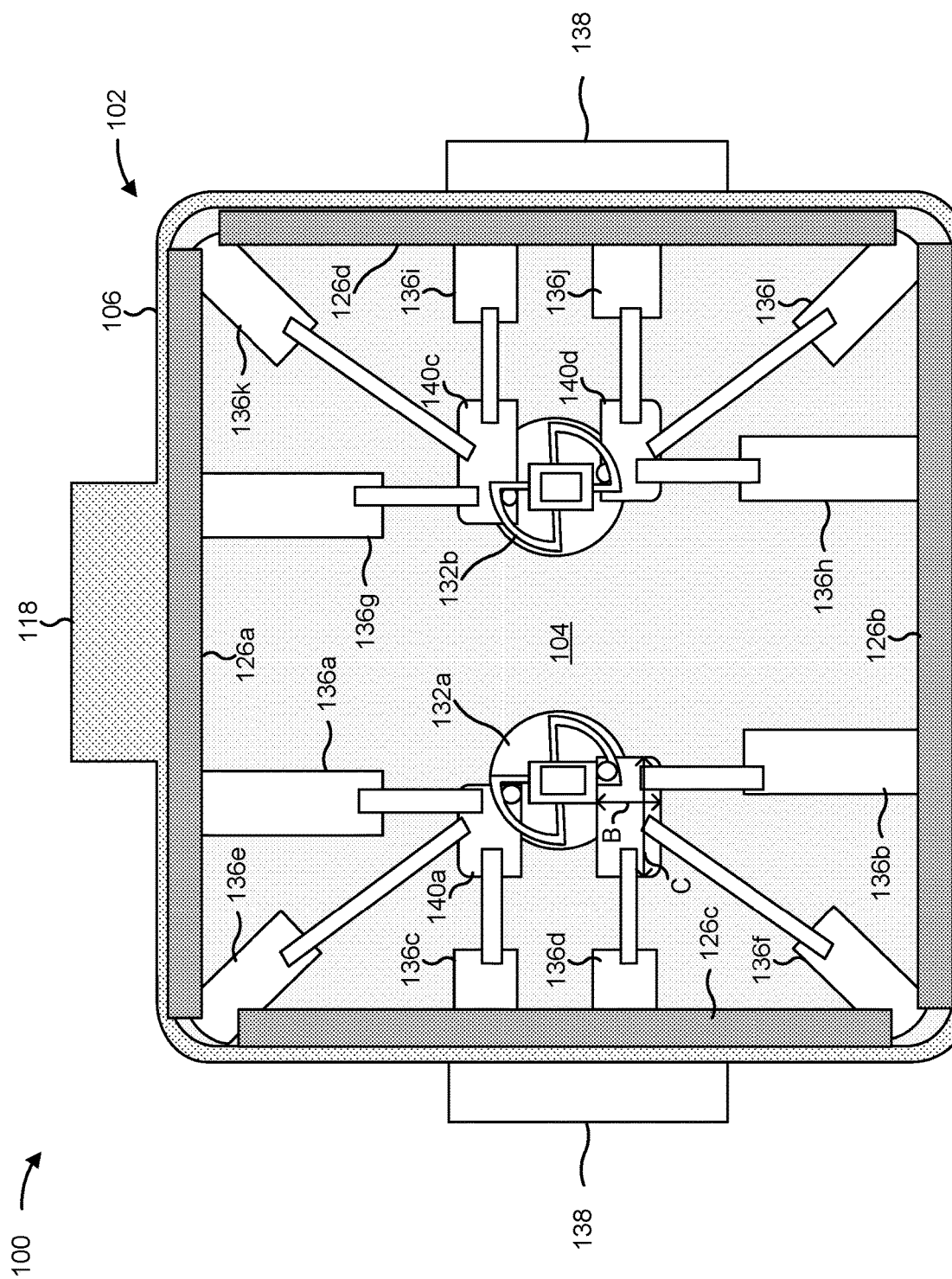

FIG. 1C illustrates a cross-section of a front elevation view of the wafer transport container 100 including the door 104 and the housing 102. FIG. 1C illustrates an extended configuration of the magnets 126 in which the door 104 is locked or installed on the housing 102. As shown in FIG. 1C, the magnets 126 may be included around the perimeter of the door 104 such that the magnetic attraction force between the magnets 124 and the magnets 126 may evenly press or bias the door 104 against the gasket 130 to minimize and/or prevent gaps, between the inner side 128 of the door 104 and the gasket 130, that would otherwise break the air-tight seal around the opening 108.

As further shown in FIG. 1C, the magnets 126 may include a first pair of magnets 126a and 126b configured to interface with the first pair of magnets 124a and 124b, and a second pair of magnets 126c and 126d configured to interface with the second pair magnets 124c and 124d. In some implementations, the door 104 may include a greater quantity of or fewer magnets 126. In the extended configuration, the magnet 126a may be extended near a first side (e.g., a top side) of the door 104 such that the magnet 126a is magnetically coupled to the magnet 124a by a magnetic attraction force. The magnet 126b may be extended near a second side (e.g., a bottom side) of the door 104 opposing the first side, such that the magnet 126b is magnetically coupled to the magnet 124b by a magnetic attraction force. The magnet 126c may be extended near a third side (e.g., a left side) of the door 104 such that the magnet 126c is magnetically coupled to the magnet 124c by a magnetic attraction force. The magnet 126d may be extended near a fourth side (e.g., a right side) of the door 104 opposing the third side such that the magnet 126d is magnetically coupled to the magnet 124d by a magnetic attraction force.

As further shown in FIG. 1C, the latches 132 may include a latch 132a and a latch 132b. The latches 132a and 132b may be actuated in a synchronized manner to cause the magnets 126 to transition to the extended configuration. Each of the latches 132a and 132b may be configured to individually move or actuate one or more of the magnets 126, and/or the latches 132a and 132b may be configured to cooperatively move or actuate one or more of the magnets 126 in synchronization. For example, the latch 132a may be configured to independently move or actuate the magnet 126c, the latch 132b may be configured to independently move or actuate the magnet 126d, and the latches 132a and 132b may be configured to cooperatively move or actuate the magnets 126a and 126b in synchronization (e.g., such that the magnets 126a and 126b are smoothly and evenly moved or actuated).

Each of the latches 132a and 132b may be coupled or connected to a respective subset of the support members 136. For example, the latch 132a may be coupled with a support member 136a, a support member 136b, a support member 136c, a support member 136d, a support member 136e, and a support member 136f. The latch 132b may be coupled with a support member 136g, a support member 136h, a support member 136i, a support member 136j, a support member 136k, and a support member 136l.

A subset of support members 136 may be coupled with a latch 132 by a connecting plate 140. A connecting plate 140 may enable the actuation of a latch 132 to synchronously move or actuate a subset of support members 136. For example, the support members 136a, 136c, and 136e may be coupled with the latch 132a by a connecting plate 140a. The support members 136b, 136d, and 136f may be coupled with the latch 132a by a connecting plate 140b. The support members 136g, 136i, and 136k may be coupled with the latch 132b by a connecting plate 140c. The support members 136h, 136j, and 136l may be coupled with the latch 132b by a connecting plate 140d. An example height (B) of a connecting plate 140 may be in a range of approximately 1 millimeter to approximately 50 millimeters to provide sufficient strength for the connecting plate 140 and to provide sufficient area to attach the support members 136 to the connecting plate 140. However, other values for the height (B) are within the scope of the present disclosure. An example width (C) of a connecting plate 140 may be in a range of approximately 1 millimeter to approximately 50 millimeters to provide sufficient strength for the connecting plate 140 and to provide sufficient area to attach the support members 136 to the connecting plate 140. However, other values for the width (C) are within the scope of the present disclosure.

A support member 136 may be coupled with one or more of the magnets 126. For example, the support members 136a and 136g may each be coupled with the magnet 126a, the support members 136b and 136h may each be coupled with the magnet 126b, the support members 136c and 136d may each be coupled with the magnet 126c, and the support members 136i and 136j may each be coupled with the magnet 126d. As another example, the support member 136e may be coupled with the magnets 126a and 126c, the support member 136f may be coupled with the magnets 126b and 126c, the support member 136k may be coupled with the magnets 126a and 126d, and the support member 136l may be coupled with the magnets 126b and 126d.

Figure 1D:
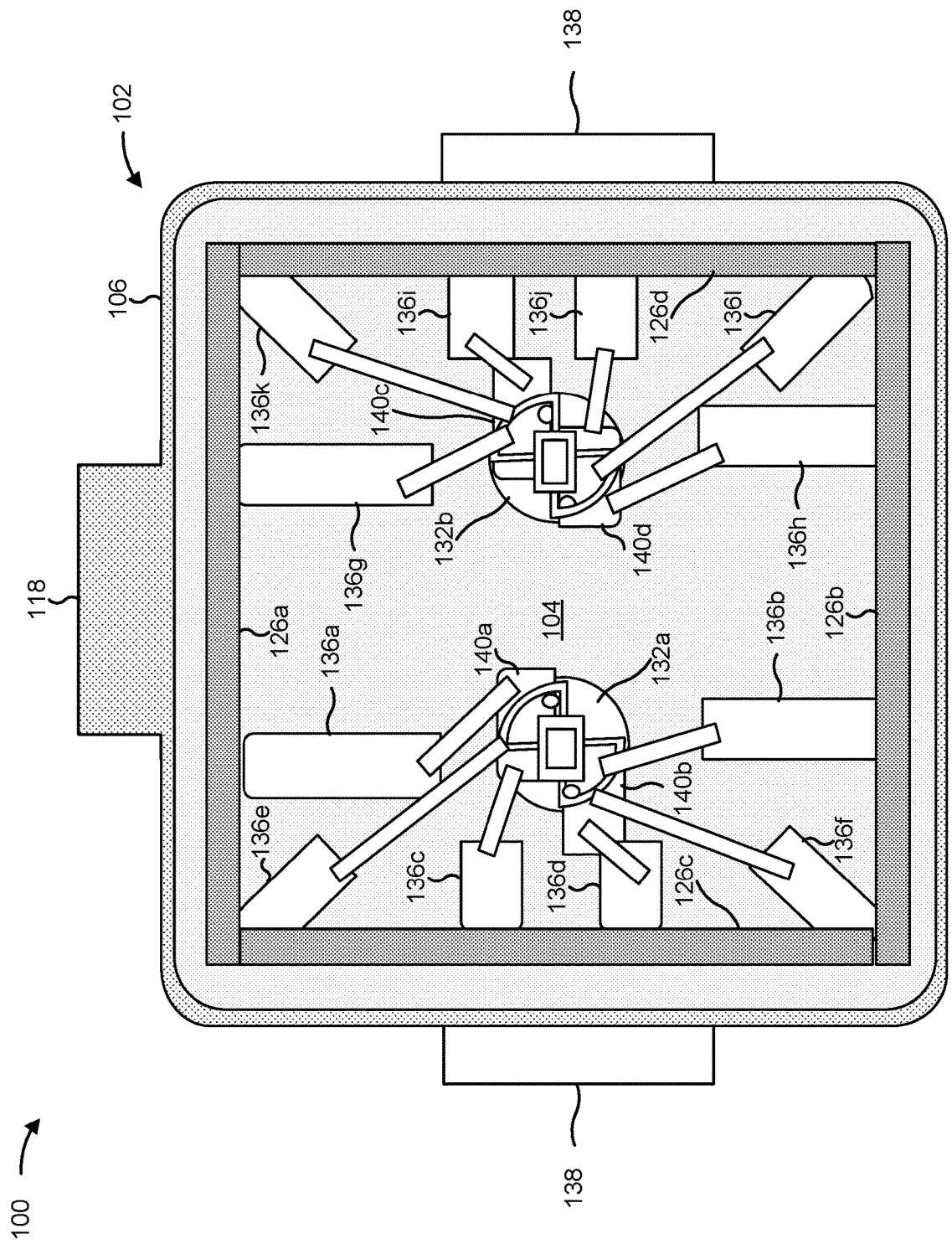

FIG. 1D illustrates a cross-section of another front elevation view of the wafer transport container 100 including the door 104 and the housing 102. FIG. 1D illustrates a retracted configuration of the magnets 126 in which the door 104 is placed on the housing 102 but not locked or installed. In other words, the door 104 is placed over the opening 108 of the housing 102, but the magnetic attraction force between the magnets 124 and the magnets 126 is weakened or reduced such that the door 104 is not secured onto the housing 102 by the magnetic attraction force and such that the door 104 is not biased or pressed against the gasket 130.

As shown in FIG. 1D, actuation of the latches 132 may cause the support members 136 to retract the magnets 126 away from the perimeter of the door 104 and inward toward the center of the door 104. This moves the magnets 126 away from the magnets 124, which weakens or reduces the magnetic attraction force between the magnets 124 and the magnets 126. The weakened or reduced magnetic attraction force permits the door 104 to be removed from the housing 102. FIG. 1D illustrates an example in which actuation of the latches 132 includes rotating the latches 132, which may cause the connecting plates 140 to pull the support members 136 to retract the magnets 126. In some implementations, other actuation techniques may be used to retract the magnets 126.

Figure 1E:
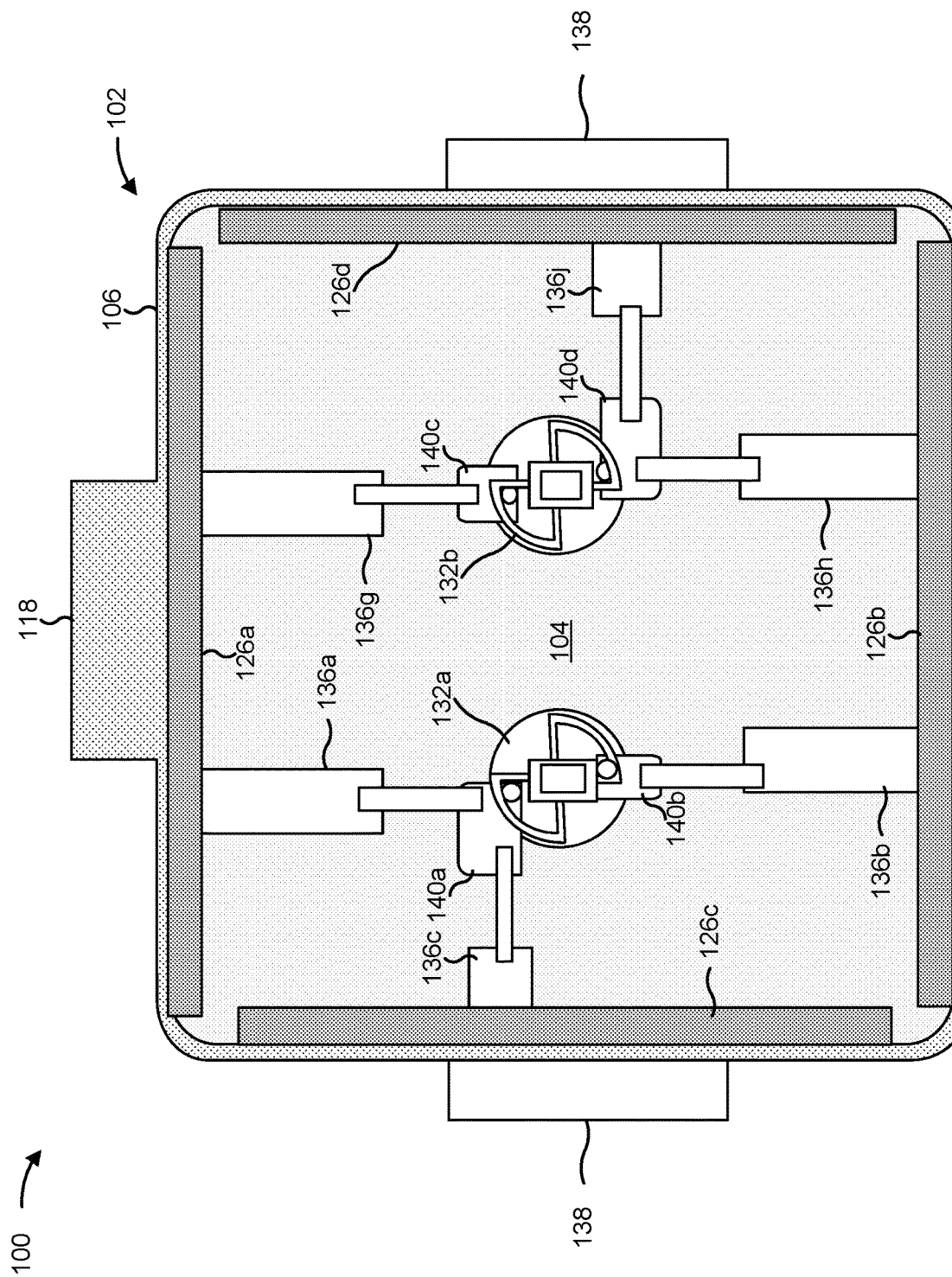
Figure 1F:
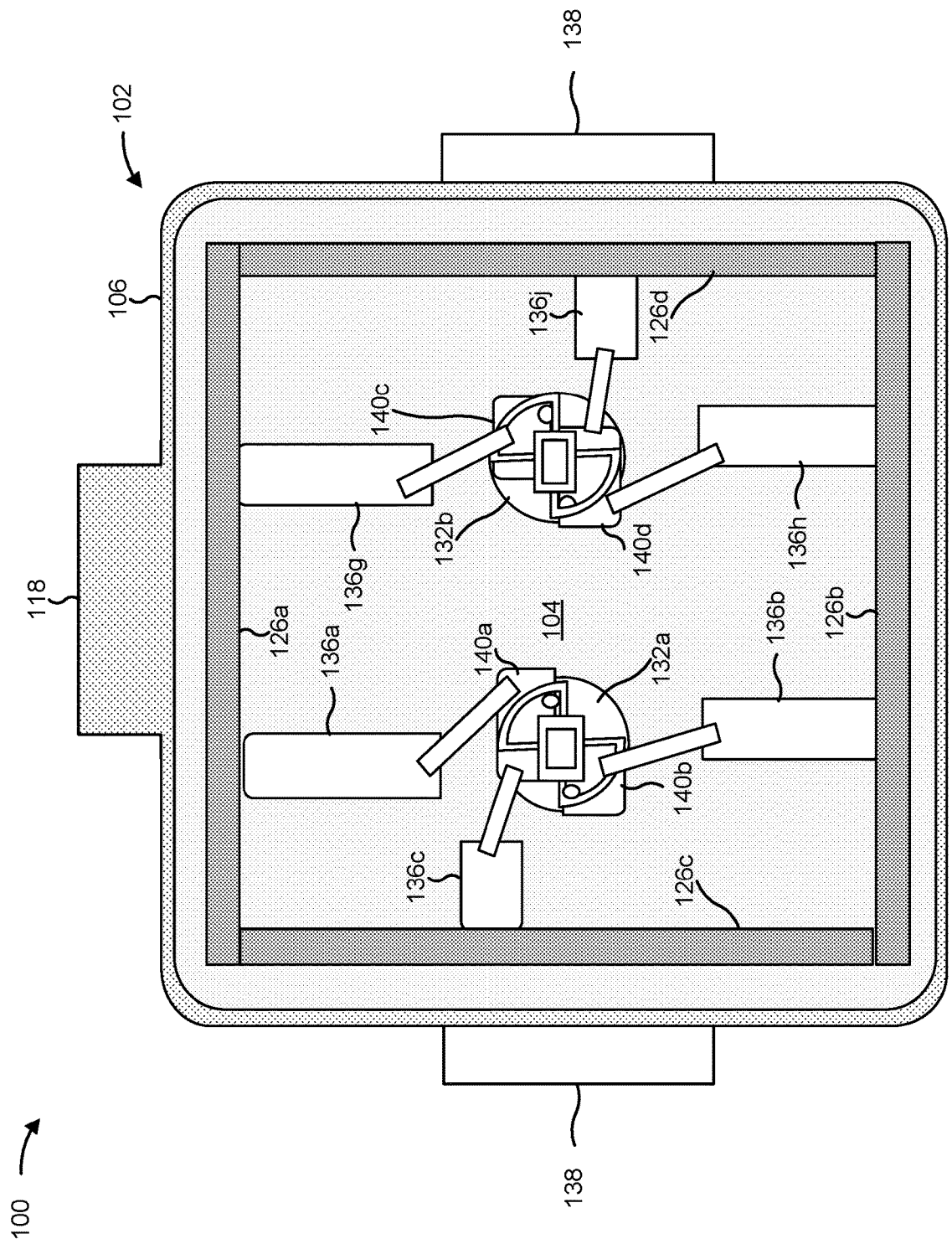

FIGS. 1E and 1F illustrate an alternative implementation of the support members 136. In particular, the alternative implementation illustrated in FIGS. 1E and 1F include support members 136*a*, 136*b*, 136*c*, 136*g*, 136*h*, and 136*j*, whereas the implementation illustrated in FIGS. 1C and D include support members 136*a*-136*j*. The fewer support members 136 of the implementation illustrated in FIGS. 1E and 1F may provide a simplified design that is less complex to manufacture while still providing adequate operation of the magnets 126.

Figure 1G:
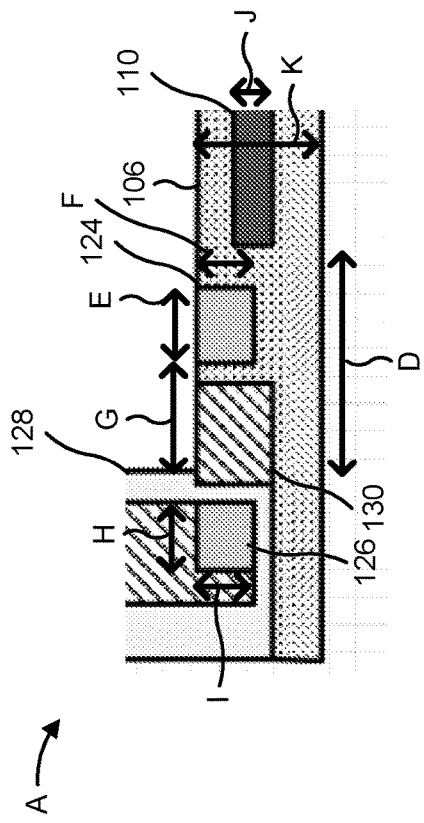

FIG. 1G illustrates a close-up view of a portion A in from FIG. 1A of various dimensional parameters of the wafer transport container 100. As shown in FIG. 1G, an example dimensional parameter of the wafer transport container 100 includes a distance (D) between the inner side 128 of the door 104 and the cavity 110. An example range for the distance (D) may include from approximately 1 millimeter to approximately 50 millimeters to ensure that the cavity 110 encompasses a large enough area of the shell 106 to provide sufficient environmental isolation in the housing 102. However, other values for the distance (D) are within the scope of the present disclosure.

Another example dimensional parameter of the wafer transport container 100 includes a width (E) of the magnets 124. An example range for the width (E) may include from approximately 1 millimeter to approximately 30 millimeters to reduce breakage of the magnets 124 and to provide sufficient magnetic attraction force between the magnets 124 and the magnets 126. However, other values for the width (E) are within the scope of the present disclosure. Another example dimensional parameter of the wafer transport container 100 includes a height (F) of the magnets 124. An example range for the height (F) may include from approximately 1 millimeter to approximately 30 millimeters to reduce breakage of the magnets 124 and to provide sufficient magnetic attraction force between the magnets 124 and the magnets 126. However, other values for the height (F) are within the scope of the present disclosure.

Another example dimensional parameter of the wafer transport container 100 includes a distance (G) between the inner side 128 of the door 104 and the magnets 124. An example range for the distance (G) may include from approximately 1 millimeter to approximately 50 millimeters to provide sufficient magnetic attraction force between the magnets 124 and the magnets 126. However, other values for the distance (G) are within the scope of the present disclosure.

Another example dimensional parameter of the wafer transport container 100 includes a width (H) of the magnets 126. An example range for the width (H) may include from approximately 1 millimeter to approximately 30 millimeters to reduce breakage of the magnets 126 and to provide sufficient magnetic attraction force between the magnets 124 and the magnets 126. However, other values for the width (H) are within the scope of the present disclosure. Another example dimensional parameter of the wafer transport container 100 includes a height (I) of the magnets 126. An example range for the height (I) may include from approximately 1 millimeter to approximately 30 millimeters to reduce breakage of the magnets 126 and to provide sufficient magnetic attraction force between the magnets 124 and the magnets 126. However, other values for the height (I) are within the scope of the present disclosure.

Another example dimensional parameter of the wafer transport container 100 includes a thickness (J) of the cavity 110. An example range for the thickness (J) may include from approximately 1 millimeter to approximately 10 millimeters to ensure that the cavity 110 is thick enough area of the shell 106 to provide sufficient environmental isolation in the housing 102. However, other values for the thickness (J) are within the scope of the present disclosure. Another example dimensional parameter of the wafer transport container 100 includes a thickness (K) of the shell 106. An example range for the thickness (K) may include from approximately 1 millimeter to approximately 30 millimeters to provide structural rigidity for the shell 106 and to conform to the weight carrying capacity of an OHT or AMHS configured to transport the transport carrier 100. However, other values for the thickness (K) are within the scope of the present disclosure. In some implementations, a ratio between the thickness (J) and the thickness (K) may be in a range of approximately 0.03 to approximately 10 so that the size of the cavity 110 does not compromise the structural integrity of the shell 106 and the structural rigidity of the shell 106. However, other values for the ratio are within the scope of the present disclosure.

As indicated above, FIGS. 1A-1G are provided as examples. Other examples may differ from what is described with regard to FIGS. 1A-1G.

Figure 2A:
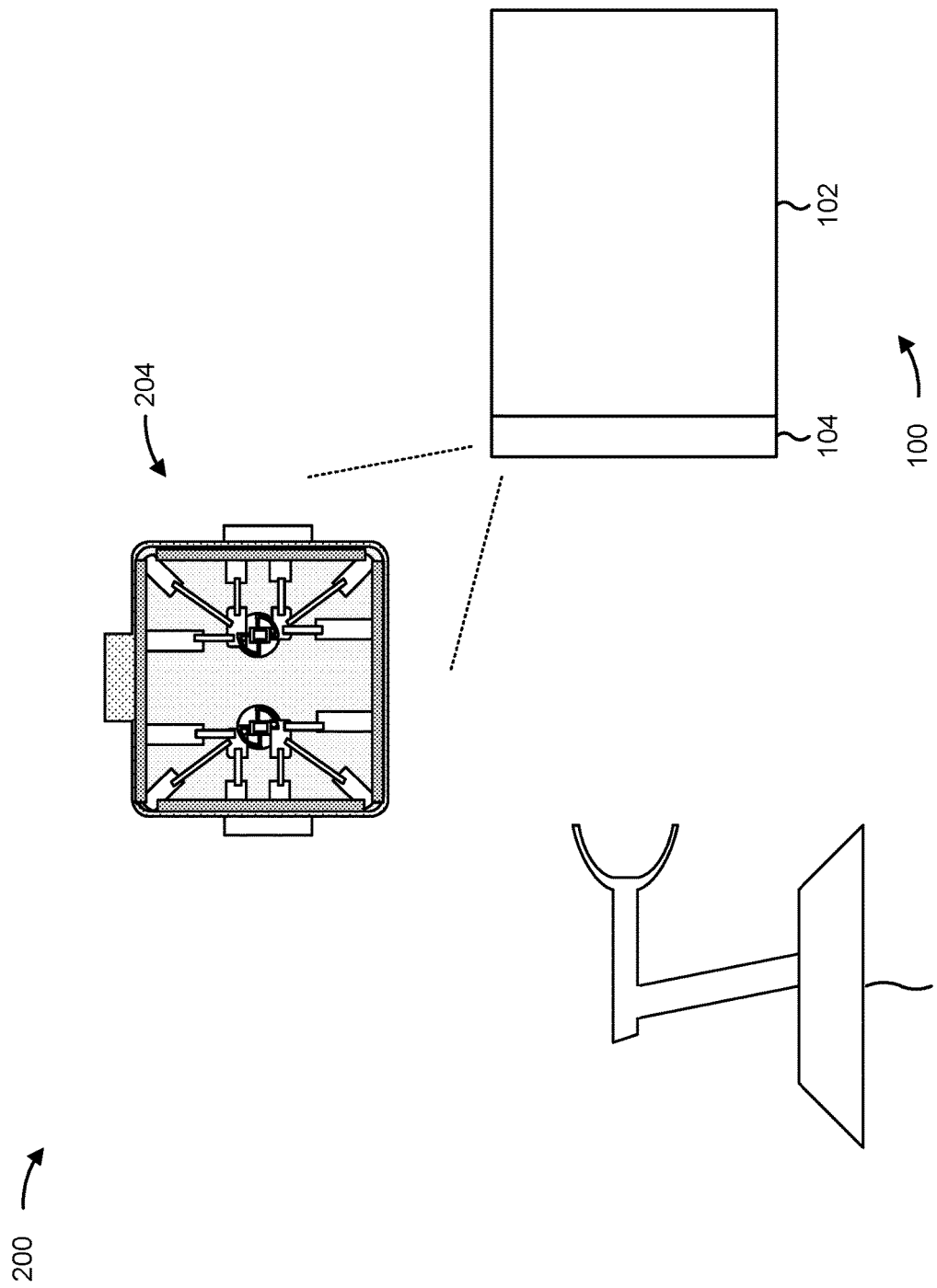
FIGS. 2A-2D are diagrams of an example implementation described herein.

FIGS. 2A-2D are diagrams of an example implementation 200 described herein. Example implementation 200 may illustrate an example process for accessing the wafer transport container 100. As shown in FIG. 2A, the wafer transport container 100 may be accessed by a wafer transport tool 202. The wafer transport tool 202 may include a robot arm, a mobile robot, an EFEM robot, or another type of tool that is capable of transferring wafers to and from the wafer transport container 100. As further shown in FIG. 2A, the wafer transport container 100 may be configured in an extended configuration 204, in which the door 104 is installed on the housing 102 of the wafer transport container 100. The details of the extended configuration 204 are described above in connection with FIG. 1C or FIG. 1E.

Figure 2B:
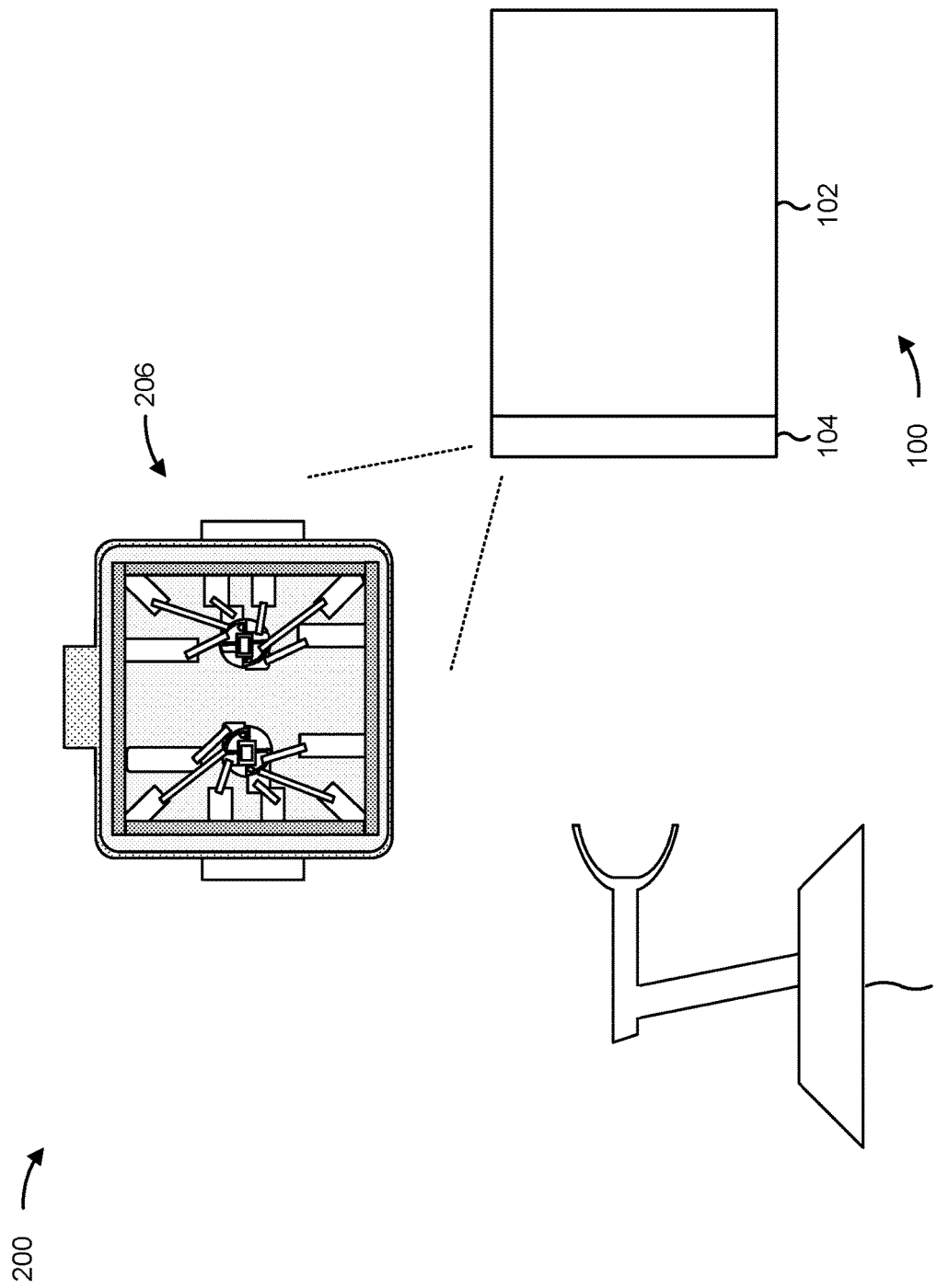

As shown in FIG. 2B, the wafer transport container 100 may be transitioned to a retracted configuration 206, in which the magnets 126 of the door 104 are moved away from the perimeter of the door 104 to reduce the magnetic attraction force between the magnets 126 and the magnets 124 on the housing 102. This unlatches or unlocks the door 104, which removes the air-tight seal between the door 104 and the gasket 130, and permits the door 104 to be removed from the housing 102. The details of the retracted configuration 206 are described above in connection with FIG. 1D or FIG. 1F.

The wafer transport container 100 may be transitioned to the retracted configuration 206 by actuating the latches 132 on the door 104. In some implementations, the wafer transport tool 202 actuates the latches 132 on the door 104 to cause the wafer transport container 100 to be transitioned from the extended configuration 204 to the retracted configuration 206. In some implementations, another device such as a wafer transport container door removal device of an interface tool (e.g., an EFEM or similar tool) actuates the latches 132 on the door 104 to cause the wafer transport container 100 to be transitioned from the extended configuration 204 to the retracted configuration 206.

Figure 2C:
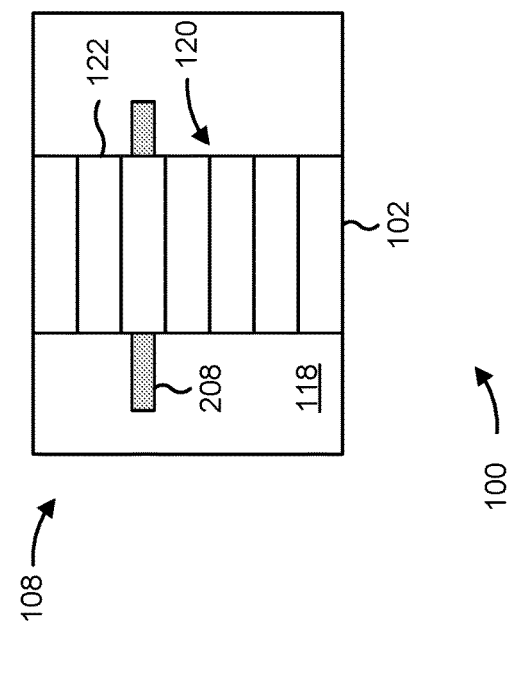
Figure 2C:
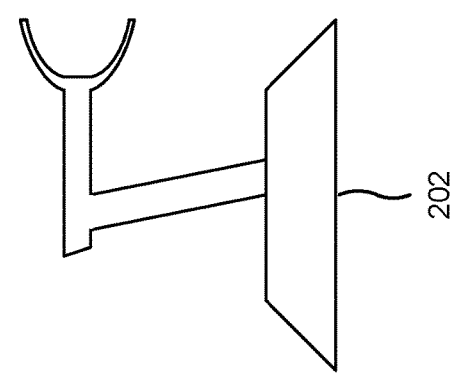

As shown in FIG. 2C, the door 104 may be removed from the housing 102 after the door 104 is unlatched or unlocked from the housing 102, as described above in connection with FIG. 2B. This permits the wafer transport tool 202 to access a wafer 208 stored in a slot 122 of the wafer rack 120 in the housing 102. In some implementations, the wafer transport tool 202 removes the door 104 from the housing 102. In some implementations, another device such as a wafer transport container door removal device of an interface tool (e.g., an EFEM or similar tool) removes the door 104 from the housing 102.

Figure 2D:
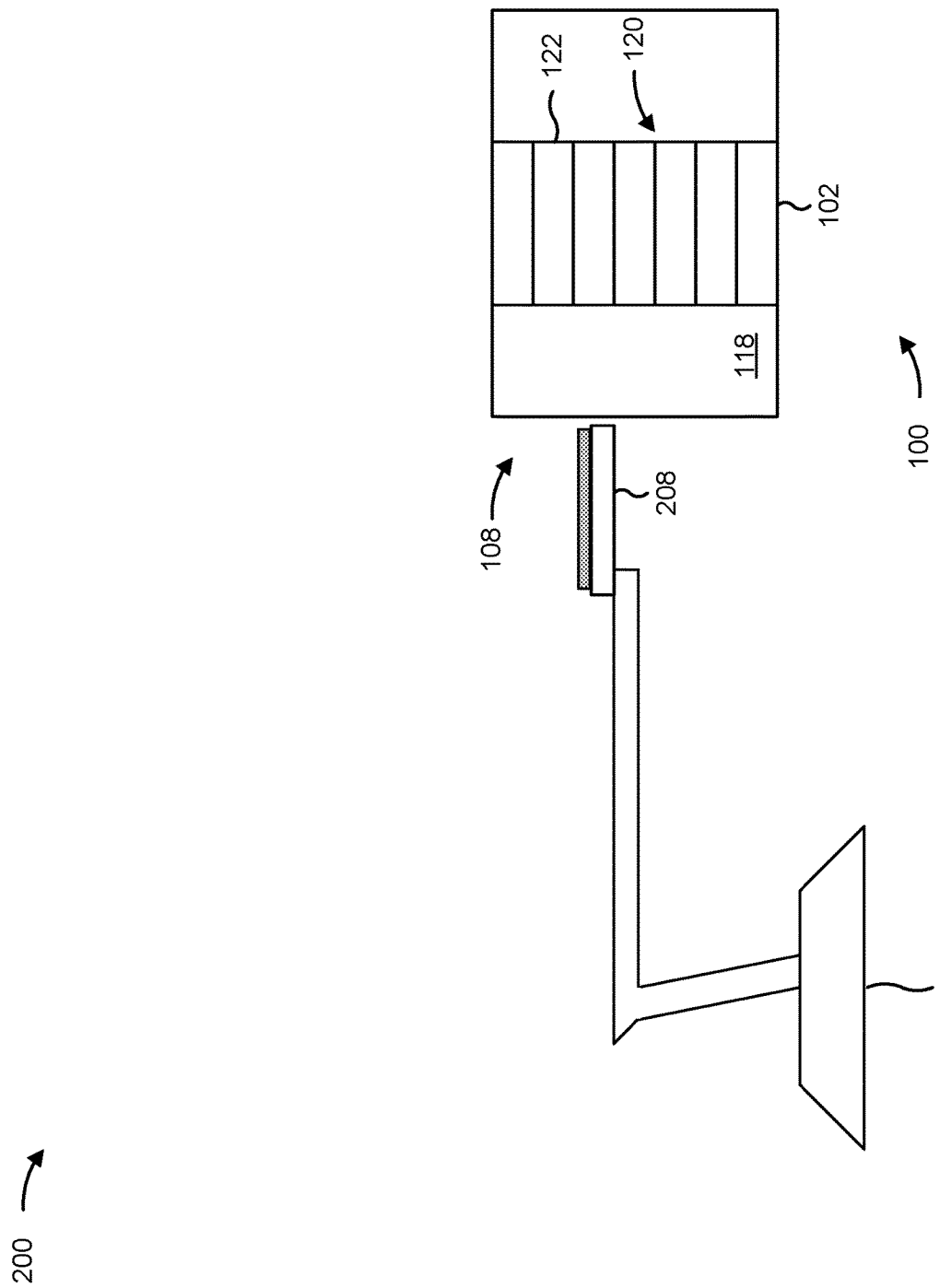

As shown in FIG. 2D, the wafer transport tool 202 may access the wafer 208 stored in the slot 122 after the door 104 is removed from the housing 102. In particular, the wafer transport tool 202 may extend an arm of the wafer transport tool 202 into the housing 102 to obtain the wafer 208. The wafer transport tool 202 may retract the arm to remove the wafer 208 from the housing 102. The wafer transport tool 202 may then transport the wafer to another wafer transport container, to a semiconductor processing tool, to staging area, or to another location.

As indicated above, FIGS. 2A-2D are provided as an example. Other examples may differ from what is described with regard to FIGS. 2A-2D.

Figure 3A:
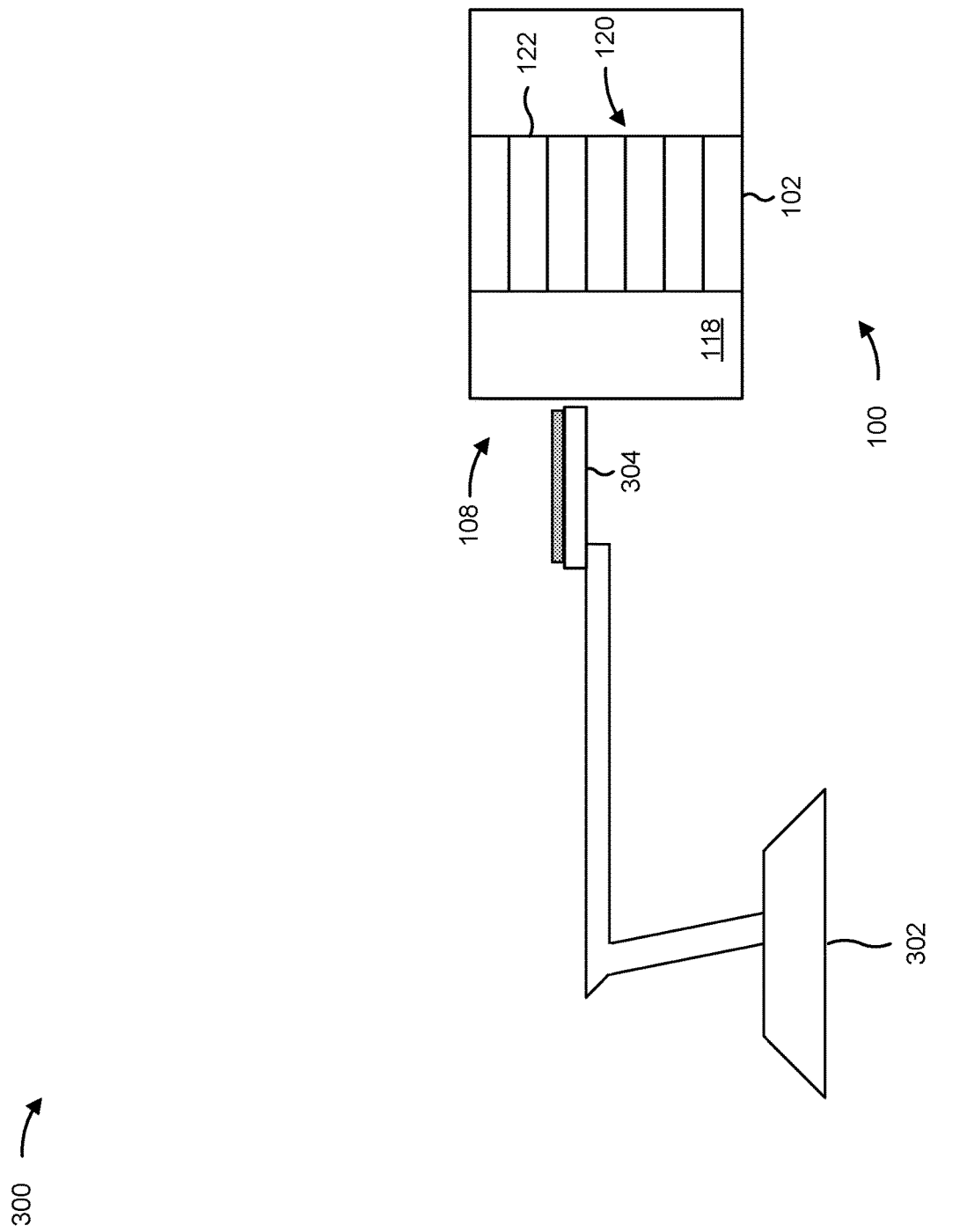
FIGS. 3A-3D are diagrams of an example implementation described herein.

FIGS. 3A-3D are diagrams of an example implementation 300 described herein. Example implementation 300 may illustrate an example process for accessing the wafer transport container 100. As shown in FIG. 3A, the wafer transport container 100 may be accessed by a wafer transport tool 302. The wafer transport tool 302 may include a robot arm, a mobile robot, an EFEM robot, or another type of tool that is capable of transferring wafers to and from the wafer transport container 100. As further shown in FIG. 3A, the wafer transport tool 302 may obtain a wafer 304 from another wafer transport container, from a semiconductor processing tool, from a staging area, or from another location.

Figure 3B:
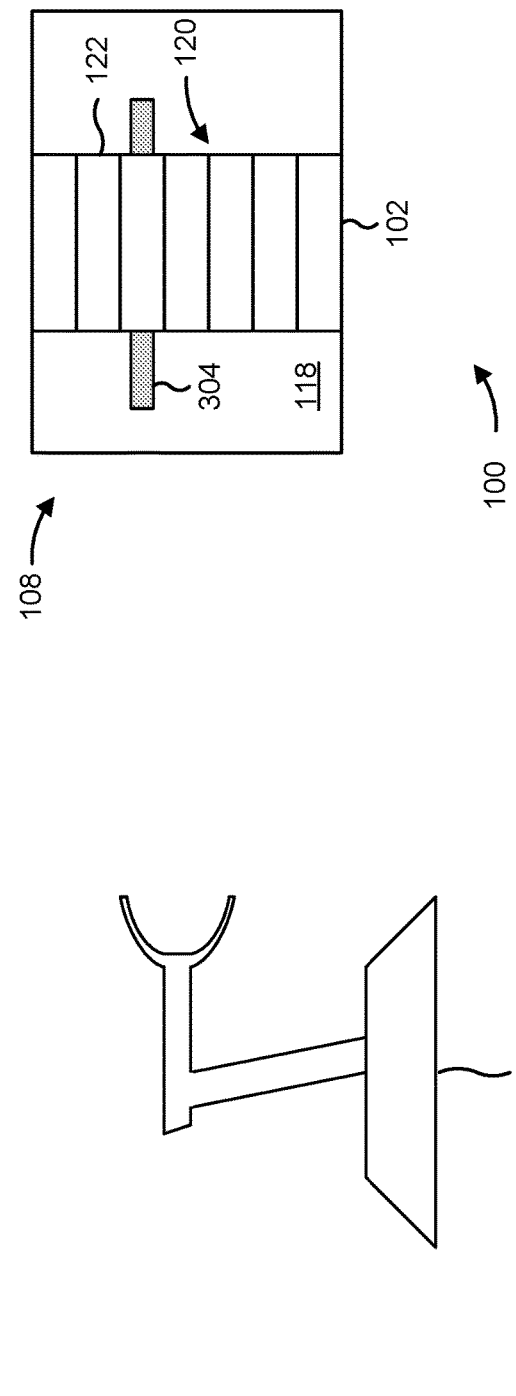

As shown in FIG. 3B, the wafer transport tool 302 may access the wafer transport container 100 to store the wafer 304 in the housing 102. In particular, the wafer transport tool 302 may extend an arm of the wafer transport tool 302 into the housing 102 to store the wafer 304 in a slot 122 of the wafer rack 120 in the housing 102 while the door 104 is removed from the housing 102.

Figure 3C:
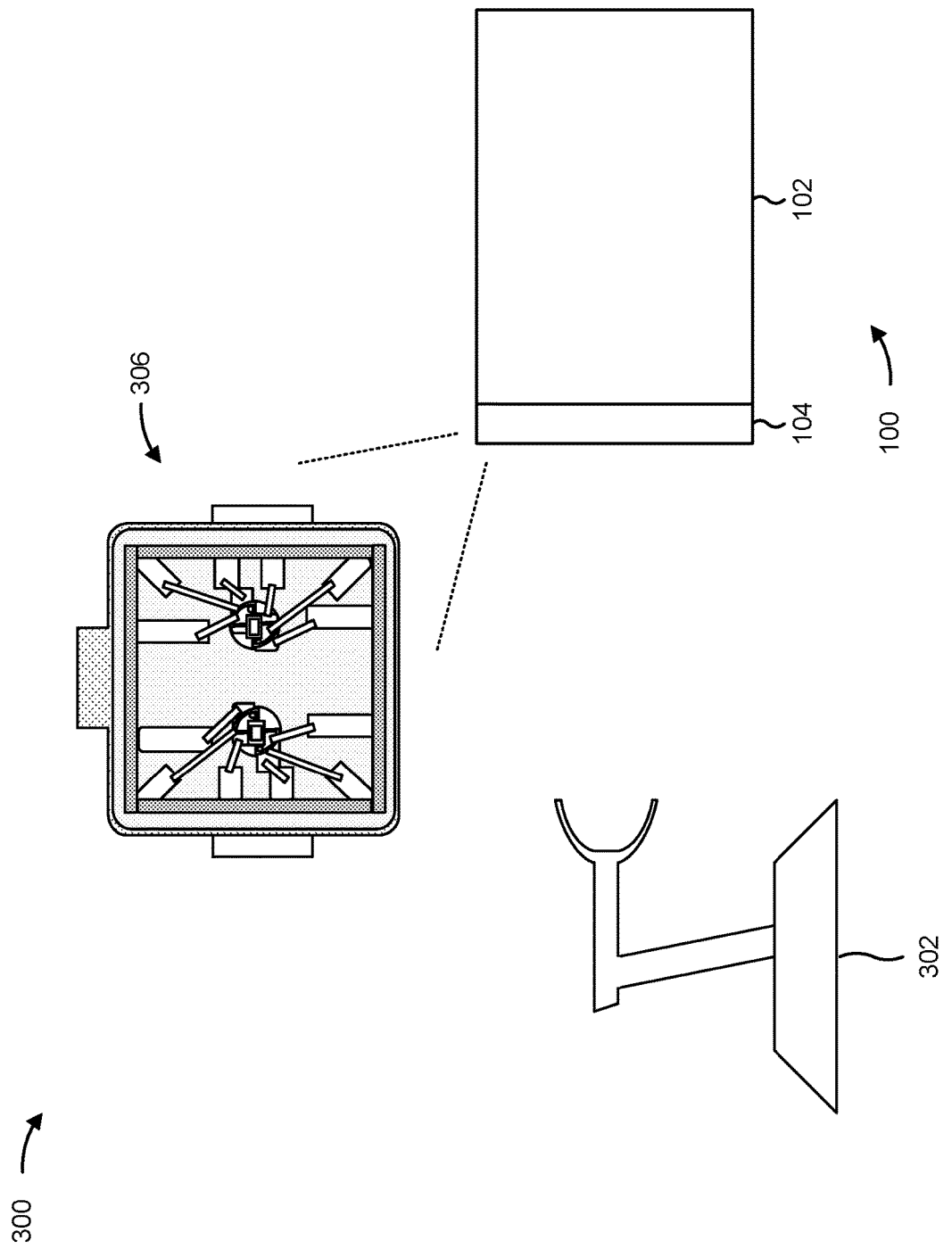

As shown in FIG. 3C, the door 104 of the wafer transport container 100 may be placed onto the housing 102 over the opening 108 and pressed against the housing 102. The door 104 may be placed onto the housing 102 in a retracted configuration 306, in which the magnets 126 are retracted away from the perimeter of the door 104. The details of the retracted configuration 306 are described above in connection with FIG. 1C or FIG. 1E. In some implementations, the wafer transport tool 302 places the door 104 onto the housing 102. In some implementations, another device such as a wafer transport container door removal device of an interface tool (e.g., an EFEM or similar tool) places the door 104 onto the housing 102.

Figure 3D:
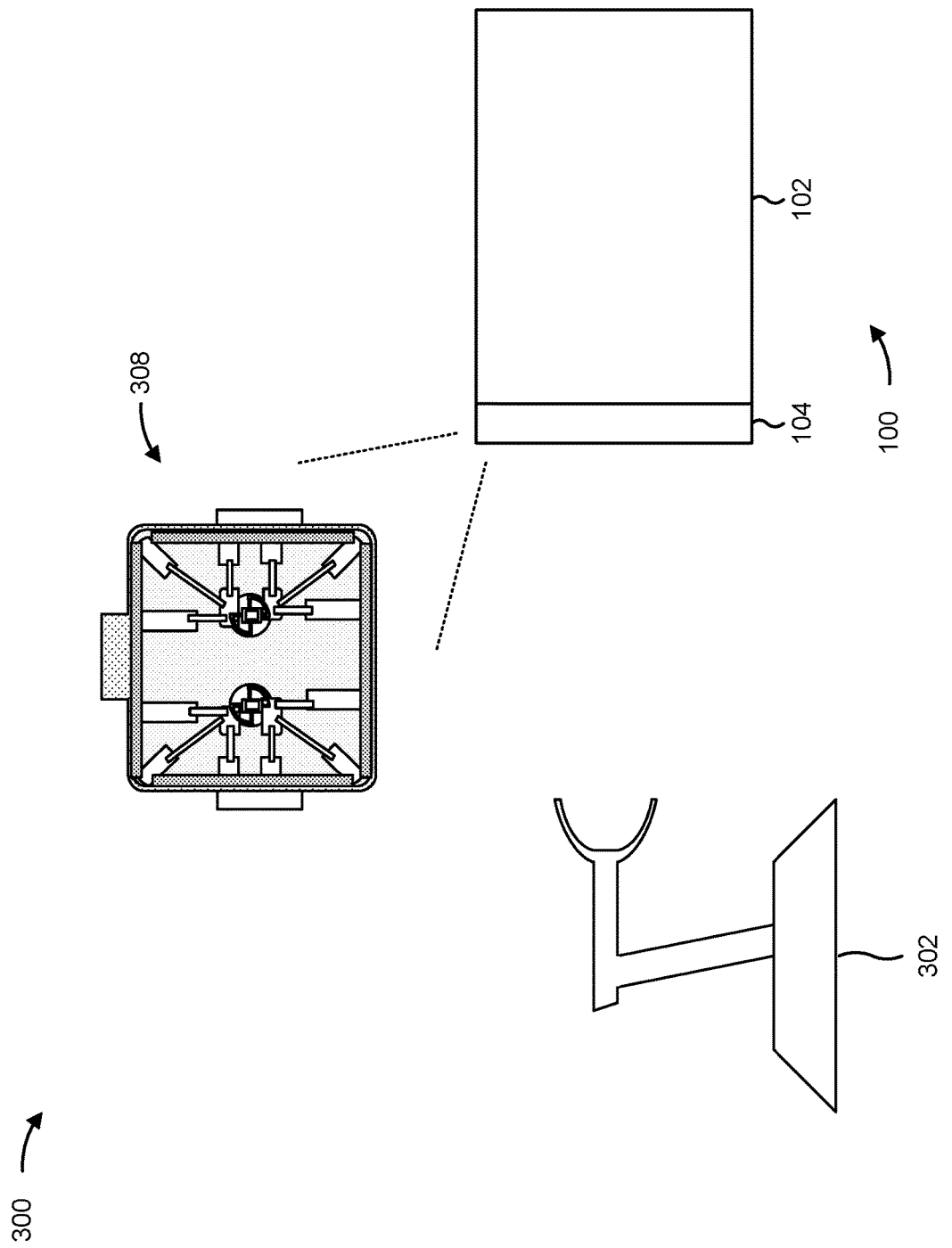

As shown in FIG. 3D, the wafer transport container 100 may be transitioned to an extended configuration 308, in which the magnets 126 of the door 104 are extended toward the perimeter of the door 104 to increase the magnetic attraction force between the magnets 126 and the magnets 124 on the housing 102. This latches or locks the door 104 onto the housing 102 against the gasket 130, which forms an air-tight seal between the door 104 and the gasket 130. The details of the extended configuration 308 are described above in connection with FIG. 1D or FIG. 1F.

The wafer transport container 100 may be transitioned to the extended configuration 308 by actuating the latches 132 on the door 104. In some implementations, the wafer transport tool 302 actuates the latches 132 on the door 104 to cause the wafer transport container 100 to be transitioned from the retracted configuration 306 to the extended configuration 308. In some implementations, another device such as a wafer transport container door removal device of an interface tool (e.g., an EFEM or similar tool) actuates the latches 132 on the door 104 to cause the wafer transport container 100 to be transitioned from the retracted configuration 306 to the extended configuration 308.

As indicated above, FIGS. 3A-3D are provided as an example. Other examples may differ from what is described with regard to FIGS. 3A-3D.

Figure 4:
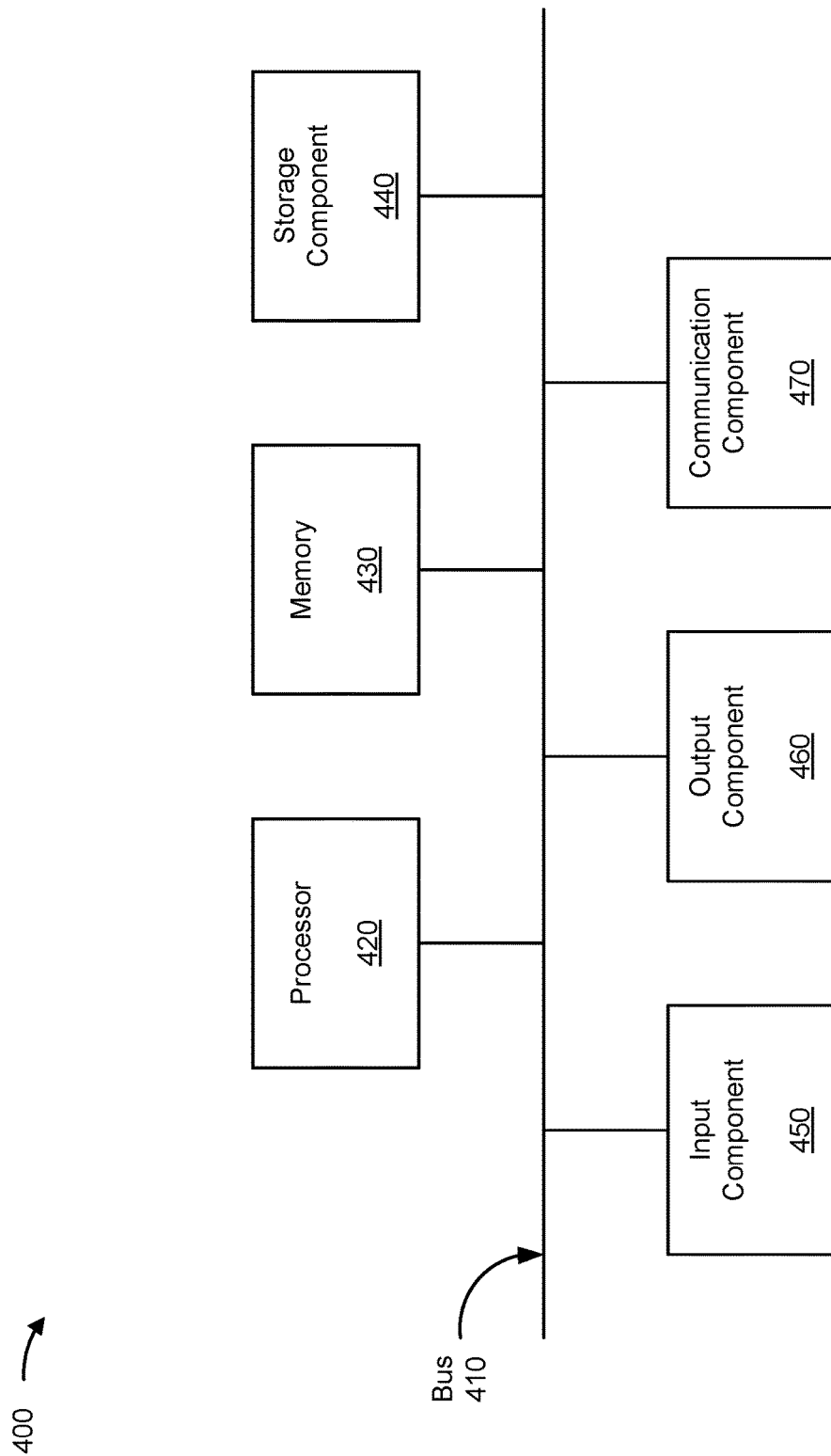
FIG. 4 is a diagram of example components of one or more devices of FIG. 1.

FIG. 4 is a diagram of example components of a device 400. In some implementations, the wafer transport tool 202 and/or the wafer transport tool 302 may include one or more devices 400 and/or one or more components of device 400. As shown in FIG. 4, device 400 may include a bus 410, a processor 420, a memory 430, a storage component 440, an input component 450, an output component 460, and a communication component 470.

Bus 410 includes a component that enables wired and/or wireless communication among the components of device 400. Processor 420 includes a central processing unit, a graphics processing unit, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 includes one or more processors capable of being programmed to perform a function. Memory 430 includes a random access memory, a read only memory, and/or another type of memory (e.g., a flash memory, a magnetic memory, and/or an optical memory).

Storage component 440 stores information and/or software related to the operation of device 400. For example, storage component 440 may include a hard disk drive, a magnetic disk drive, an optical disk drive, a solid state disk drive, a compact disc, a digital versatile disc, and/or another type of non-transitory computer-readable medium. Input component 450 enables device 400 to receive input, such as user input and/or sensed inputs. For example, input component 450 may include a touch screen, a keyboard, a keypad, a mouse, a button, a microphone, a switch, a sensor, a global positioning system component, an accelerometer, a gyroscope, and/or an actuator. Output component 460 enables device 400 to provide output, such as via a display, a speaker, and/or one or more light-emitting diodes. Communication component 470 enables device 400 to communicate with other devices, such as via a wired connection and/or a wireless connection. For example, communication component 470 may include a receiver, a transmitter, a transceiver, a modem, a network interface card, and/or an antenna.

Device 400 may perform one or more processes described herein. For example, a non-transitory computer-readable medium (e.g., memory 430 and/or storage component 440) may store a set of instructions (e.g., one or more instructions, code, software code, and/or program code) for execution by processor 420. Processor 420 may execute the set of instructions to perform one or more processes described herein. In some implementations, execution of the set of instructions, by one or more processors 420, causes the one or more processors 420 and/or the device 400 to perform one or more processes described herein. In some implementations, hard-wired circuitry may be used instead of or in combination with the instructions to perform one or more processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
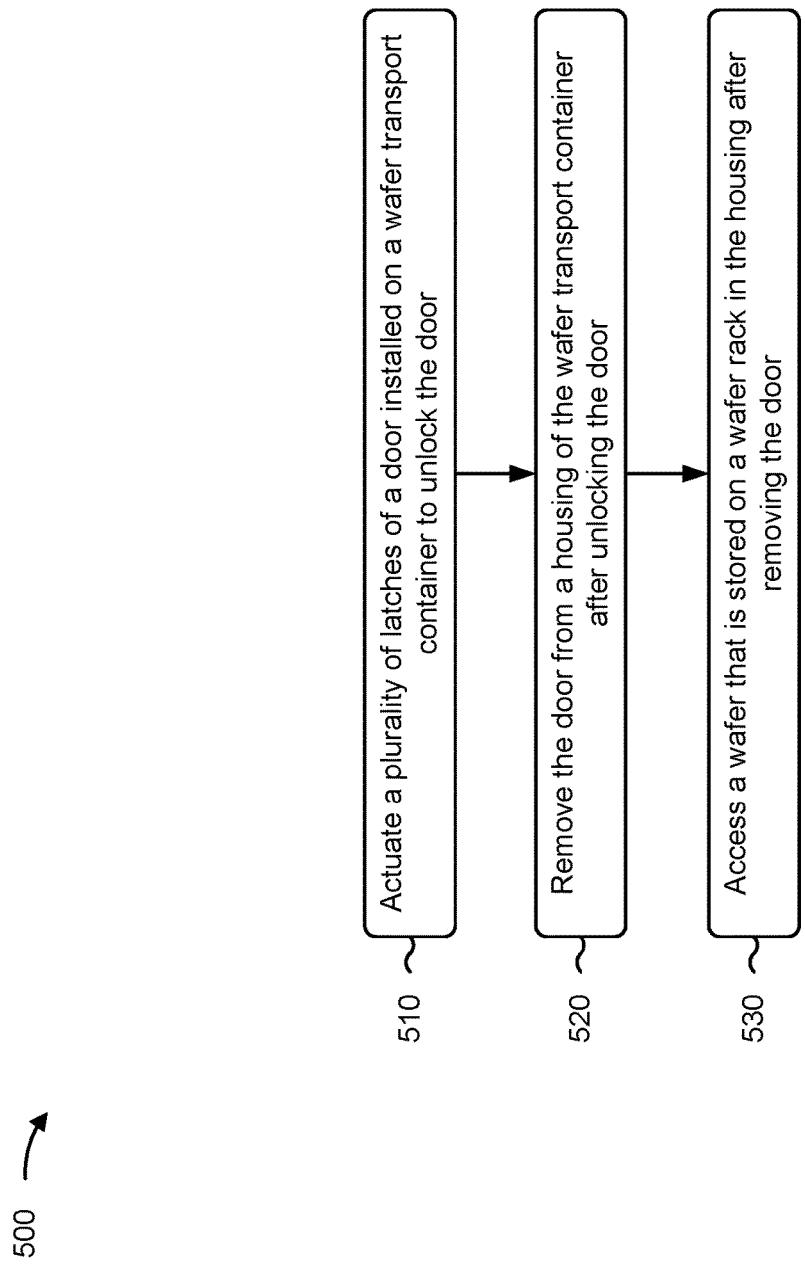
FIGS. 5 and 6 are flowcharts of example processes relating to accessing a wafer transport container.

FIG. 5 is a flowchart of an example process 500 associated with accessing a wafer transport container. In some implementations, one or more process blocks of FIG. 5 may be performed by a wafer transport tool (e.g., the wafer transport tool 202). In some implementations, one or more process blocks of FIG. 5 may be performed by another device or a group of devices separate from or including the wafer transport tool, such as a wafer transport carrier door removal device. Additionally, or alternatively, one or more process blocks of FIG. 5 may be performed by one or more components of device 400, such as processor 420, memory 430, storage component 440, input component 450, output component 460, and/or communication component 470.

As shown in FIG. 5, process 500 may include actuating a plurality of latches of a door installed on a wafer transport container to unlock the door (block 510). For example, the wafer transport tool (or a wafer transport carrier door removal device) may actuate the plurality of latches 132a, 132b of the door 104 installed on the wafer transport container 100 to unlock the door 104, as described above. In some implementations, actuating the plurality of latches 132a, 132b causes the plurality of magnets 126 included on the door 104 to transition from the extended configuration 204 to the retracted configuration 206. In some implementations, the plurality of magnets 126 includes a first magnet 126a near a first side of the door 104, a second magnet 126b near a second side of the door 104 opposing the first side, a third magnet 126c near a third side of the door 104, and a fourth magnet 126d near a fourth side of the door 104 opposing the third side.

As further shown in FIG. 5, process 500 may include removing the door from a housing of the wafer transport container after unlocking the door (block 520). For example, the wafer transport tool (or a wafer transport carrier door removal device) may remove the door 104 from the housing 102 of the wafer transport container 100 after unlocking the door 104, as described above.

As further shown in FIG. 5, process 500 may include accessing a wafer that is stored on a wafer rack in the housing after removing the door (block 530). For example, the wafer transport tool may access the wafer 208 that is stored on the wafer rack 120 in the housing after removing the door, as described above.

Process 500 may include additional implementations, such as any single implementation or any combination of implementations described below and/or in connection with one or more other processes described elsewhere herein.

In a first implementation, actuating the plurality of latches 132a, 132b reduces a magnetic attraction force between the plurality of magnets 126 on the door and another plurality of magnets 124 on the housing 102 to permit the door 104 to be removed from the housing 102. In a second implementation, alone or in combination with the first implementation, removing the door 104 from the housing 102 releases an air-tight seal between the door 104 and the housing 102.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 6:
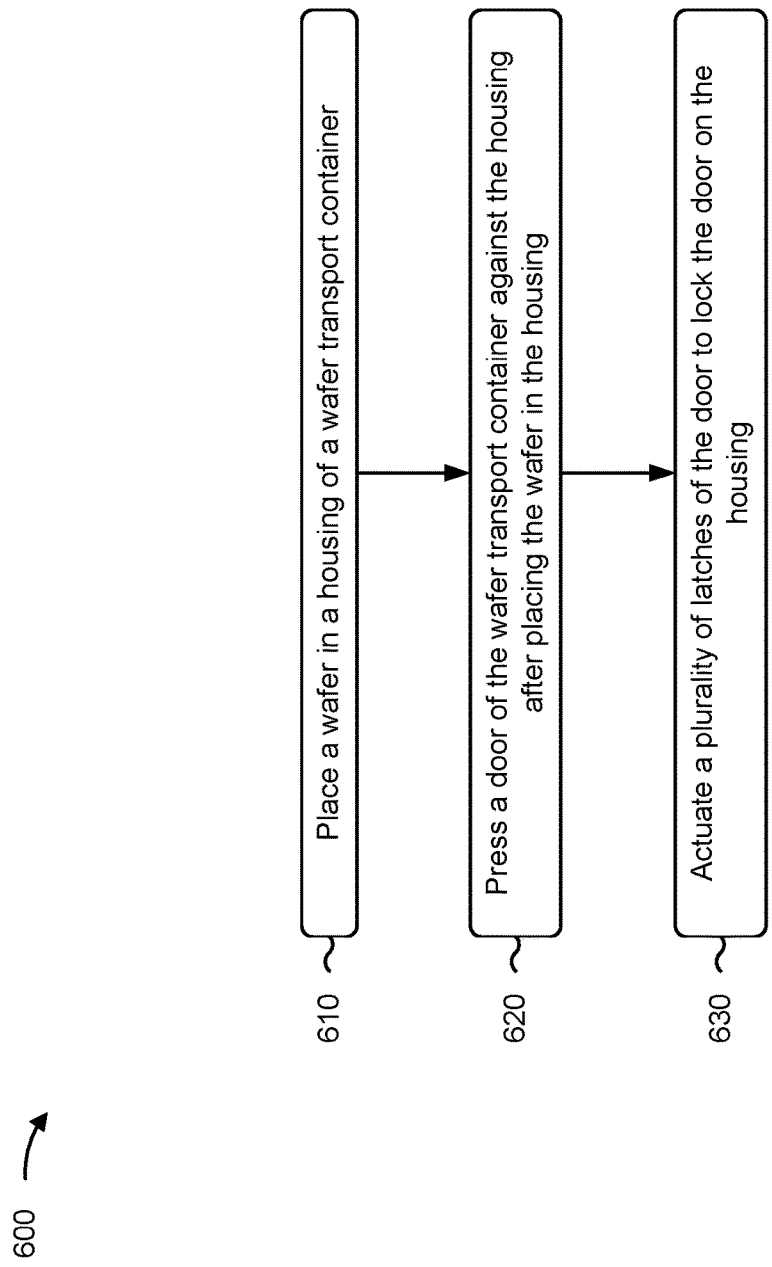

FIG. 6 is a flowchart of an example process 600 associated with accessing a wafer transport container. In some implementations, one or more process blocks of FIG. 6 may be performed by a wafer transport tool (e.g., the wafer transport tool 302). In some implementations, one or more process blocks of FIG. 6 may be performed by another device or a group of devices separate from or including the wafer transport tool, such as a wafer transport carrier door removal device. Additionally, or alternatively, one or more process blocks of FIG. 6 may be performed by one or more components of device 400, such as processor 420, memory 430, storage component 440, input component 450, output component 460, and/or communication component 470.

As shown in FIG. 6, process 600 may include placing a wafer in a housing of a wafer transport container (block 610). For example, the wafer transport tool may place the wafer 304 in the housing 102 of the wafer transport container 100, as described above.

As further shown in FIG. 6, process 600 may include pressing a door of the wafer transport container against the housing after placing the wafer in the housing (block 620). For example, the wafer transport tool (or a wafer transport carrier door removal device) may press the door 104 of the wafer transport container 100 against the housing 102 after placing the wafer 304 in the housing 102, as described above.

As further shown in FIG. 6, process 600 may include actuating a plurality of latches of the door to lock the door on the housing (block 630). For example, the wafer transport tool (or a wafer transport carrier door removal device) may actuate the plurality of latches 132a, 132b of the door 104 to lock the door 104 on the housing 102, as described above. In some implementations, actuating the plurality of latches 132a, 132b causes the first plurality of magnets 126 included around a perimeter of the door 104 to transition from the retracted configuration 306 to the extended configuration 308. In some implementations, the door 104 is held against the housing 102 by a magnetic attraction force between the first plurality of magnets 126 in the extended configuration 308 and the second plurality of magnets 124 around a perimeter of the opening 108 of the housing.

Process 600 may include additional implementations, such as any single implementation or any combination of implementations described below and/or in connection with one or more other processes described elsewhere herein.

In a first implementation, placing the wafer 304 in the housing 102 includes placing the wafer 304 on a wafer rack 120 in the housing 102, where the wafer rack 120 is integrated into a shell 106 of the housing 102. In a second implementation, alone or in combination with the first implementation, the shell 106 of the housing 102 is hollow and filled with an inert gas. In a third implementation, alone or in combination with one or more of the first and second implementations, pressing the door 104 of the wafer transport container 100 against the housing 102 includes pressing the door 104 against a gasket 130 around a perimeter of the opening 108.

In a fourth implementation, alone or in combination with one or more of the first through third implementations, the magnetic attraction force biases the door 104 against the gasket 130 to form an air-tight seal around the opening of the housing 102 between the door 104 and the gasket 130. In a fifth implementation, alone or in combination with one or more of the first through fourth implementations, actuating a first latch 132a of the plurality of latches 132a, 132b causes a first magnet 126a, a second magnet 126b, and a third magnet 126c of the first plurality of magnets 126 to transition from the retracted configuration 306 to the extended configuration 308, and where actuating a second latch 132b of the plurality of latches 132a, 132b causes the first magnet 126a, the second magnet 126b, and a fourth magnet 126d of the first plurality of magnets 126 to transition from the retracted configuration 306 to the extended configuration 308.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In this way, a wafer transport carrier includes various components to provide improved air sealing to reduce air leakage into the wafer transport carrier. The wafer transport carrier may include a housing having a hollow shell that contains a vacuum or an inert gas to minimize and/or prevent humidity and oxygen ingress into the wafer transport carrier, a wafer rack that is integrated into the shell of the housing to minimize and/or prevent air leakage around the wafer rack, and/or an enhanced magnet-based door latch to provide air sealing around the full perimeter of the opening of the housing. These components and/or additional components described herein may reduce and/or prevent debris, moisture, and/or other types of contamination from the semiconductor fabrication facility from entering the wafer transport carrier and causing wafer defects and/or device failures. This may increase semiconductor processing yields, may reduce defects and scrap, and/or may enable longer queue times for semiconductor wafers stored in the wafer transport carrier, which supports the increase in the quantity of processing stages as semiconductor processing node sizes continue to shrink.

As described in greater detail above, some implementations described herein provide a method. The method includes actuating a plurality of latches of a door installed on a wafer transport container to unlock the door, where actuating the plurality of latches causes a plurality of magnets included on the door to transition from an extended configuration to a retracted configuration, and where the plurality of magnets includes: a first magnet near a first side of the door, a second magnet near a second side of the door opposing the first side, a third magnet near a third side of the door, and a fourth magnet near a fourth side of the door opposing the third side. The method includes removing the door from a housing of the wafer transport container after unlocking the door. The method includes accessing a wafer that is stored on a wafer rack in the housing after removing the door.

As described in greater detail above, some implementations described herein provide a wafer transport container. The wafer transport container includes a housing that includes a shell forming an internal space that is configured to hold a plurality of wafers, an opening configured to provide access to the internal space, and a first pair of magnets and a second pair of magnets that are positioned around a perimeter of the opening of the housing. The wafer transport container includes a door configured to form an air-tight seal around the perimeter of the opening, comprising, a third pair of magnets and a fourth pair of magnets that are positioned around a perimeter of the door, where the third pair of magnets is configured to interface with the first pair of magnets, and where the fourth pair of magnets is configured to interface with the second pair of magnets.

As described in greater detail above, some implementations described herein provide a method. The method includes placing a wafer in a housing of a wafer transport container. The method includes pressing a door of the wafer transport container against the housing after placing the wafer in the housing. The method includes actuating a plurality of latches of the door to lock the door on the housing, where actuating the plurality of latches causes a first plurality of magnets included around a perimeter of the door to transition from a retracted configuration to an extended configuration, and where the door is held against the housing by a magnetic attraction force between the first plurality of magnets in the extended configuration and a second plurality of magnets around a perimeter of an opening of the housing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer transport container, comprising:
   a housing, comprising:
      a shell forming an internal space that is configured to hold a plurality of wafers;
      an opening configured to provide access to the internal space; and
      a first pair of magnets and a second pair of magnets that are positioned around a perimeter of the opening of the housing; and
   a door configured to form an air-tight seal around the perimeter of the opening, comprising:
      a third pair of magnets and a fourth pair of magnets that are positioned around a perimeter of the door,
         wherein the third pair of magnets is configured to interface with the first pair of magnets, and
         wherein the fourth pair of magnets is configured to interface with the second pair of magnets;
      a first latch;
      a second latch;
      a first support member connected to the first latch and a magnet of the third pair of magnets; and
      a second support member connected to the second latch and the magnet.

2. The wafer transport container of claim 1, wherein the first pair of magnets comprises:
   a first magnet at a first side of the housing; and
   a second magnet at a second side of the housing opposing the first side of the housing; and
   wherein the second pair of magnets comprises:
      a third magnet at a third side of the housing, and
      a fourth magnet at a fourth side of the housing opposing the third side of the housing.

3. The wafer transport container of claim 2,
wherein the magnet is a fifth magnet at a first side of the door and configured to interface with the first magnet;
wherein the third pair of magnets comprises a sixth magnet, at a second side of the door, configured to interface with the second magnet; and
wherein the fourth pair of magnets comprises:
a seventh magnet, at a third side of the door, configured to interface with the third magnet, and
an eighth magnet, at a fourth side of the door opposing the third side of the door, configured to interface with the fourth magnet.

4. The wafer transport container of claim 1, wherein the shell is hollow and includes a cavity to provide temperature isolation and humidity isolation for the internal space.

5. The wafer transport container of claim 4, wherein the cavity is filled with an inert gas.

6. The wafer transport container of claim 4, wherein a vacuum is formed in the cavity.

7. The wafer transport container of claim 1, wherein the housing further comprises:
a gasket around the perimeter of the opening,
wherein the door is configured to form the air-tight seal against the gasket.

8. The wafer transport container of claim 7,
wherein the first latch and the second latch are configured to selectively:
move the third pair of magnets and the fourth pair of magnets to an extended configuration in which the door is latched onto the housing, and
move the third pair of magnets and the fourth pair of magnets to a retracted configuration in which the door is unlatched from the housing.

9. The wafer transport container of claim 8, wherein the door further comprises:
a first plurality of support members connected to the first latch,
wherein the first plurality of support members comprises the first support member; and
a second plurality of support members connected to the second latch,
wherein the second plurality of support members comprises the second support member.

10. The wafer transport container of claim 9, wherein the magnet is a first magnet;
wherein a third support member of the first plurality of support members is connected to a second magnet of the third pair of magnets;
wherein a fourth support member of the first plurality of support members is connected to a third magnet of the fourth pair of magnets;
wherein a fifth support member of the second plurality of support members is connected to the second magnet; and
wherein a sixth support member of the second plurality of support members is connected to a fourth magnet of the fourth pair of magnets.

11. The wafer transport container of claim 1, wherein the housing further comprises:
a wafer rack configured to support the plurality of wafers,
wherein the shell and the wafer rack are an integrated one-piece component.

12. A door of a wafer transport container, comprising:
a first pair of magnets configured to interface with a third pair of magnets of a housing of the wafer transport container;
a second pair of magnets configured to interface with a fourth pair of magnets of the housing,
wherein the first pair of magnets and the second pair of magnets are positioned around a perimeter of the door;
a first latch;
a second latch;
a first support member connected to the first latch and a magnet of the first pair of magnets; and
a second support member connected to the second latch and the magnet.

13. The door of claim 12,
wherein the magnet is a first magnet at a first side of the door;
wherein the first pair of magnets comprises a second magnet at a second side of the door opposing the first side of the door; and
wherein the second pair of magnets comprises:
a third magnet at a third side of the door, and
a fourth magnet at a fourth side of the door opposing the third side of the door.

14. The door of claim 12,
wherein the first latch and the second latch are configured to selectively:
move the first pair of magnets and the second pair of magnets to an extended configuration in which the door is latched onto the housing, and
move the first pair of magnets and the second pair of magnets to a retracted configuration in which the door is unlatched from the housing.

15. The door of claim 14, further comprising:
a first plurality of support members connected to the first latch,
wherein the first plurality of support members comprises the first support member; and
a second plurality of support members connected to the second latch,
wherein the second plurality of support members comprises the second support member.

16. The door of claim 15,
wherein a third support member of the first plurality of support members is connected to a second magnet of the first pair of magnets;
wherein a fourth support member of the first plurality of support members is connected to a third magnet of the second pair of magnets;
wherein a fifth support member of the second plurality of support members is connected to the second magnet; and
wherein a sixth support member of the second plurality of support members is connected to a fourth magnet of the second pair of magnets.

17. The door of claim 16, wherein a seventh support member of the first plurality of support members is connected to the third magnet.

18. The door of claim 16, wherein a seventh support member of the first plurality of support members is connected to the first magnet and the third magnet.

19. The door of claim 14, wherein the first latch and the second latch are configured to move the first pair of magnets and the second pair of magnets in synchronization.

20. A container, comprising:
a housing, comprising:
a shell;
an opening; and a first magnet, a second magnet, a third magnet, and a fourth magnet that are positioned around a perimeter of the opening; and a door configured to form an air-tight seal around the perimeter of the opening, comprising:
   a fifth magnet and a sixth magnet that are positioned around a perimeter of the door,
      wherein the fifth magnet is configured to interface with the first magnet, and
      wherein the sixth magnet is configured to interface with the second magnet;
   a first latch;
   a second latch;
   a first support member connected to the first latch and the fifth magnet; and
   a second support member connected to the second latch and the fifth magnet.

\* \* \* \* \*

UNITED STATES PATENT AND TRADEMARK OFFICE
CERTIFICATE OF CORRECTION

PATENT NO. : 12,009,242 B2
APPLICATION NO. : 17/446404
DATED : June 11, 2024
INVENTOR(S) : Jyh-Shiou Hsu et al.

Page 1 of 1

It is certified that error appears in the above-identified patent and that said Letters Patent is hereby corrected as shown below:

In the Claims

Claim 20:
Column 16, please delete Line 66

Signed and Sealed this
Twenty-second Day of April, 2025

Coke Morgan Stewart
*Acting Director of the United States Patent and Trademark Office*